US008159871B2

(12) United States Patent
Chung

(10) Patent No.: US 8,159,871 B2
(45) Date of Patent: Apr. 17, 2012

(54) MAGNETORESISTIVE MEMORY CELL USING FLOATING BODY EFFECT, MEMORY DEVICE HAVING THE SAME, AND METHOD OF OPERATING THE MEMORY DEVICE

(75) Inventor: Sung Woong Chung, Icheon-si (KR)

(73) Assignee: Hynix Semiconductor Inc., Gyeonggi-Do (KR)

( * ) Notice: Subject to any disclaimer, the term of this patent is extended or adjusted under 35 U.S.C. 154(b) by 349 days.

(21) Appl. No.: 12/507,222

(22) Filed: Jul. 22, 2009

(65) Prior Publication Data
US 2010/0157664 A1    Jun. 24, 2010

(30) Foreign Application Priority Data

Dec. 23, 2008  (KR) .................. 10-2008-0132652

(51) Int. Cl.
*G11C 11/15* (2006.01)
(52) U.S. Cl. ..... 365/173; 365/209; 365/213; 365/225.5; 365/230.07; 365/232
(58) Field of Classification Search .................. 365/173, 365/209, 213, 225.5, 230.07, 232, 243.5
See application file for complete search history.

(56) References Cited

U.S. PATENT DOCUMENTS 6,946,712 B2 *   9/2005  Asao ............................. 257/395

* cited by examiner

*Primary Examiner* — Jason Lappas
(74) *Attorney, Agent, or Firm* — IP & T Group LLP

(57) ABSTRACT

A magnetoresistive memory cell includes an MTJ device and a select transistor. The select transistor includes a first conduction-type semiconductor layer, a gate electrode formed by disposing a gate insulating layer on top of the semiconductor layer, and first and second diffusion regions formed in the semiconductor layer to be spaced apart from each other and to have a second conduction type. A part of the semiconductor layer between the first and second diffusion regions is formed as an electrically floating body region. By using a high-performance select transistor with a floating body effect, high integration of a magnetoresistive memory device may be achieved.

17 Claims, 6 Drawing Sheets

MAGNETORESISTIVE MEMORY CELL USING FLOATING BODY EFFECT, MEMORY DEVICE HAVING THE SAME, AND METHOD OF OPERATING THE MEMORY DEVICE

CROSS-REFERENCE TO RELATED APPLICATIONS

The present invention claims priority of Korean patent application number 10-2008-0132652, filed on Dec. 23, 2008, the disclosure of which is incorporated by reference herein in its entirety.

BACKGROUND OF THE INVENTION

1. Field of the Invention

The present invention relates, in general, to Magnetic Random Access Memory (MRAM), and, more particularly, to a non-volatile memory device which uses magnetoresistance variation.

2. Description of the Related Art

Dynamic Random Access Memory (DRAM), which is a representative memory device that is currently widely used, is advantageous in that high-speed operation and high integration are possible, but is disadvantageous in that, since DRAM is volatile memory, data is lost when power is turned off, and in that, since data must be continuously rewritten through a data refresh operation even during the operation of the DRAM, power loss increases. On the other hand, flash memory having characteristics of non-volatility and high integration is disadvantageous in that the operating speed is low. In contrast, magnetoresistive memory (MRAM) which stores information using the difference between magnetoresistances is advantageous in that high integration is possible while characteristics of non-volatility and high-speed operation are realized.

Meanwhile, MRAM refers to a non-volatile memory device using magnetoresistance variation corresponding to the magnetization direction between ferromagnetic bodies. Currently, cell structures that are most frequently employed as the cells of MRAM may include a Giant Magneto-Resistance (GMR) device using GMR effect, and a Magnetic Tunnel Junction (MTJ) device using Tunnel Magneto-Resistance (TMR) effect. In addition, there is a spin-valve device which reinforces a ferromagnetic layer with a permanent magnet and employs a soft magnetic layer as a free layer to overcome the disadvantage of a GMR device. In particular, since an MTJ device has a high operation-speed and low power consumption and is used in place of the capacitor of DRAM, the MTJ device can be applied to graphic and mobile devices having low-power consumption and high speed.

Generally, a magnetoresistive device has low resistance when the spin directions of two magnetic layers (that is, the directions of magnetic momentums) are identical to each other, whereas it has high resistance when the spin directions are opposite each other. In this way, bit data can be written in a magnetoresistive memory device using the resistance change of a cell changes depending on the magnetization states of magnetic layers. Magnetoresistive memory having an MTJ structure will be described by way of an example. In an MTJ memory cell having a structure composed of a ferromagnetic layer/insulating layer/ferromagnetic layer, when electrons, passed through the first ferromagnetic layer, pass through the insulating layer used as a tunneling barrier, the tunneling probability changes depending on the magnetization direction of the second ferromagnetic layer. That is, when the magnetization directions of two ferromagnetic layers are parallel, tunneling current is maximized, whereas, when they are anti-parallel, tunneling current is minimized. For example, it can be considered that, when resistance is high, data '1' is written, and when resistance is low, data '0' is written.

FIGS. 1A and 1B are a circuit diagram and a sectional view, respectively, of an MTJ unit cell constituting a magnetoresistive memory. As shown in FIGS. 1A and 1B, an MTJ device 10 includes a pinned magnetic layer 11 having a pinned magnetization direction, a free magnetic layer 13 having a magnetization direction which can be changed to be parallel or anti-parallel with that of the pinned magnetic layer 11, and a non-magnetic layer, that is, a magnetic tunnel barrier layer 12 interposed between the pinned magnetic layer 11 and the free magnetic layer 13. Further, one Metal Oxide Semiconductor (MOS) transistor Tr, used as a switching device, is connected in series with one end of the MTJ device 10. The MOS transistor Tr is composed of a gate electrode 20 formed by disposing a gate insulating layer 22 on the top of a semiconductor substrate 100 having a first conduction type, and first and second diffusion regions 40 each having a second conduction type. Here, reference numeral 24 denotes spacers formed on the sidewalls of the gate electrode 20, and reference numeral 50 denotes a contact plug for electrically connecting the MTJ device 10 to the diffusion regions 40. FIG. 1B illustrates an N-channel MOS transistor by way of example.

In the structure of the conventional MTJ memory cell shown in FIGS. 1A and 1B, current is applied to a transistor Tr through a source line SL, and the applied current is controlled within the transistor Tr in response to a signal input through a word line WL. Further, the current controlled within the transistor Tr is output to the MTJ device 10, so that the magnetization direction of the free magnetic layer 13 is changed, and data "1" or "0" is written according to the parallel or anti-parallel state of the magnetization directions of the free magnetic layer 13 and the pinned magnetic layer 11. The data written in this way is read through a bit line BL.

In such a current switching-type magnetoresistive memory device, a single memory cell for storing information generally includes a single MTJ device and a select transistor for enabling the writing or reading of data by selecting the MTJ device. Therefore, in order to write information to be stored in the MTJ device, very high current must be caused to bidirectionally flow through the MTJ device. However, it is difficult to drive current sufficiently high to write information in the MTJ device by using a micro-transistor required for the implementation of high-integration memory.

FIG. 2 illustrates the current-voltage characteristics of a MOS transistor formed in the conventional magnetoresistive memory device shown in FIGS. 1A and 1B. With reference to FIG. 2, current-voltage characteristics at a certain gate voltage are described. As a source-drain voltage VD increases, current ID is saturated. That is, at region P, channel impedance increases as the channel of the MOS transistor is pinched off, so that the MOS transistor is operated in a region of saturated current flow. When a MOS transistor is manufactured to be of micro size for the purpose of the implementation of a high-integration memory device, the channel of the MOS transistor is shortened, and such a saturation phenomenon occurs even at a low voltage. In the region P of saturated current flow, it is difficult to obtain high current due to the saturation of current even if a drain-source voltage is increased.

Therefore, when a MOS transistor is formed on a bulk silicon substrate as in the case of the prior art, the size of the MOS transistor must be increased in order to obtain a current sufficiently high to write information in an MTJ device, thus obstructing the high-integration of a memory device. Further, when reading data, the difference between MOS currents is recognized by the difference between the drain voltages which occurs due to the difference between the resistances of the MTJ device. As shown in FIG. 2, since resistance difference ΔR is not large, read voltage difference Vr is small, and thus the current difference between data "1" and "0" generated at this time falls within a range of only several tens of percent.

Therefore, in order to increase the integration of the magnetoresistive memory device, there is a need to reduce an area in which a memory cell is formed. However, when the size of the cell is reduced, the current driving capability of a MOS transistor which is a switching device may be deteriorated, so that it may be difficult to ensure a sufficient amount of current required for the driving of the MTJ device. As a result, in a conventional magnetoresistive memory device, a device, having a very wide area in which a MOS transistor is formed, is used, and a sensing circuit for detecting a small current difference is greatly complicated and occupies a large space.

In implementing a high-integration magnetoresistive memory device, a select transistor is manufactured in an area corresponding to the size of an MTJ device, and current sufficiently high to write data in the MTJ device is desired. However, in a conventional magnetoresistive memory device, an area in which a MOS transistor is formed decreases due to the reduction of a cell area attributable to high integration, so that the current driving capability of the transistor is deteriorated, thus making it difficult to achieve the high integration of a magnetoresistive memory device.

SUMMARY OF THE INVENTION

Accordingly, exemplary embodiments of the present invention provide a magnetoresistive memory cell, which can improve the current driving capability of a select transistor required for a high-integration magnetoresistive memory device through the use of a floating-body effect, a magnetoresistive memory device having the magnetoresistive memory cell, and a method of operating the magnetoresistive memory device.

According to an embodiment, a magnetoresistive memory cell is provided, which comprises a Magnetic Tunnel Junction (MTJ) device; and a select transistor, wherein the select transistor comprises a first conduction-type semiconductor layer; a gate electrode formed by disposing a gate insulating layer on top of the semiconductor layer; and first and second diffusion regions formed in the semiconductor layer to be spaced apart from each other and to have a second conduction type, wherein a part of the semiconductor layer between the first and second diffusion regions is formed as an electrically floating body region.

Another embodiment provides a magnetoresistive memory device, comprising a memory cell including a Magnetic Tunnel Junction (MTJ) device, and a select transistor including a first conduction-type semiconductor layer, a gate electrode formed by disposing a gate insulating layer on top of the semiconductor layer, first and second diffusion regions formed in the semiconductor layer to be spaced apart from each other and to have a second conduction type, wherein a part of the semiconductor layer between the first and second diffusion regions is formed as an electrically floating body region. Further, the magnetoresistive memory device may comprise a word line electrically connected to the gate electrode, a bit line electrically connected to one of the first and second diffusion regions through the MTJ device, and a source line electrically connected to a remaining one of the first and second diffusion regions.

In addition, the magnetoresistive memory device may be operated by turning on the MOS transistor including the gate electrode, the first and second diffusion regions and the body region; and operating the BJT including the first and second diffusion regions and the body region, wherein a data write mode or read mode is executed by operating the BJT after the MOS transistor has been turned on.

Yet another embodiment provides a magnetoresistive memory device comprising a memory cell including a Magnetic Tunnel Junction (MTJ) device; and a select transistor including a Metal Oxide Semiconductor (MOS) transistor and a Bipolar Junction Transistor (BJT) that are connected in parallel, wherein the MOS transistor and the BJT are connected in common to the MTJ device, are configured to supply current to the MTJ device in response to a gate voltage applied to the gate electrode of the select transistor, and share a common floating body region between a source region and a drain regions of the select transistor.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1A:
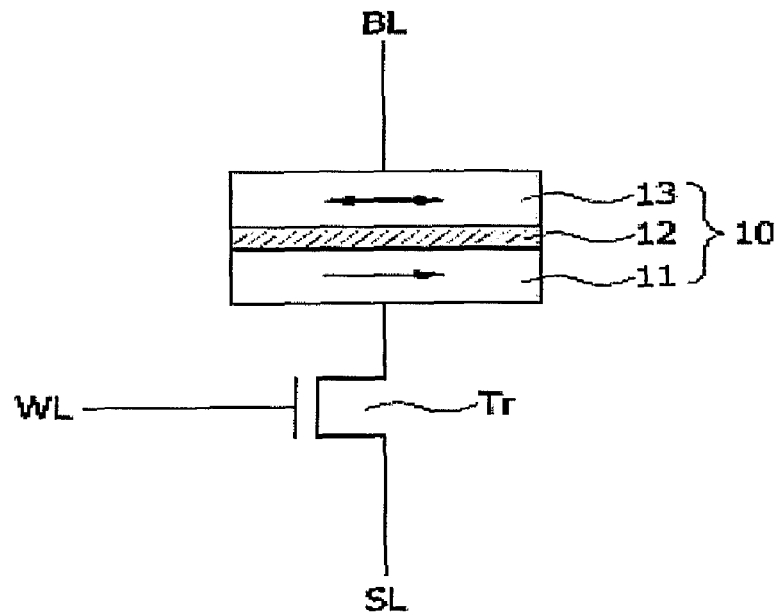
FIGS. 1A and 1B are a circuit diagram and a sectional view, respectively, of the unit cell of a conventional magnetoresistive memory device.
Figure 1B:
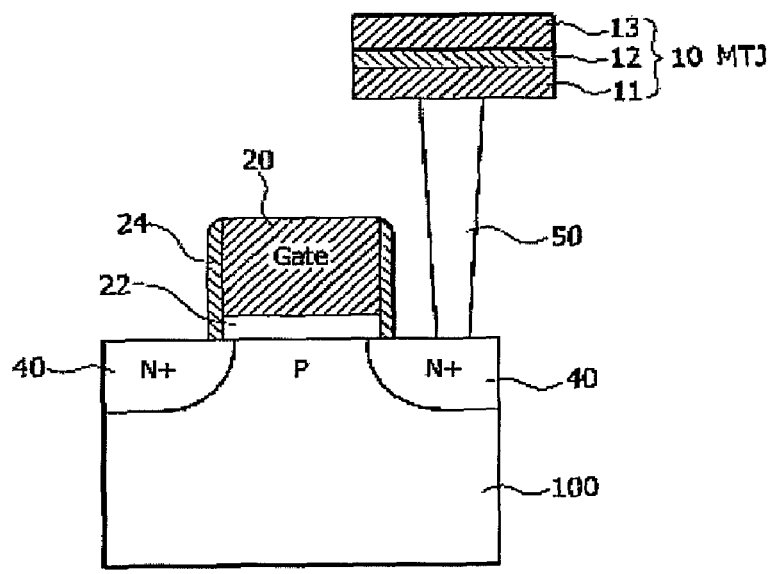

Hereinafter, embodiments of the present invention will be described in detail with reference to the attached drawings. Reference now should be made to the drawings, in which the same reference numerals are used throughout the different drawings to designate the same or similar components. In the following description of the present invention, detailed descriptions may be omitted to the extent that providing the detailed descriptions of related well-known constructions or functions may make the crux of the present invention unclear.

[Memory Cell Configuration]

Figure 3A:
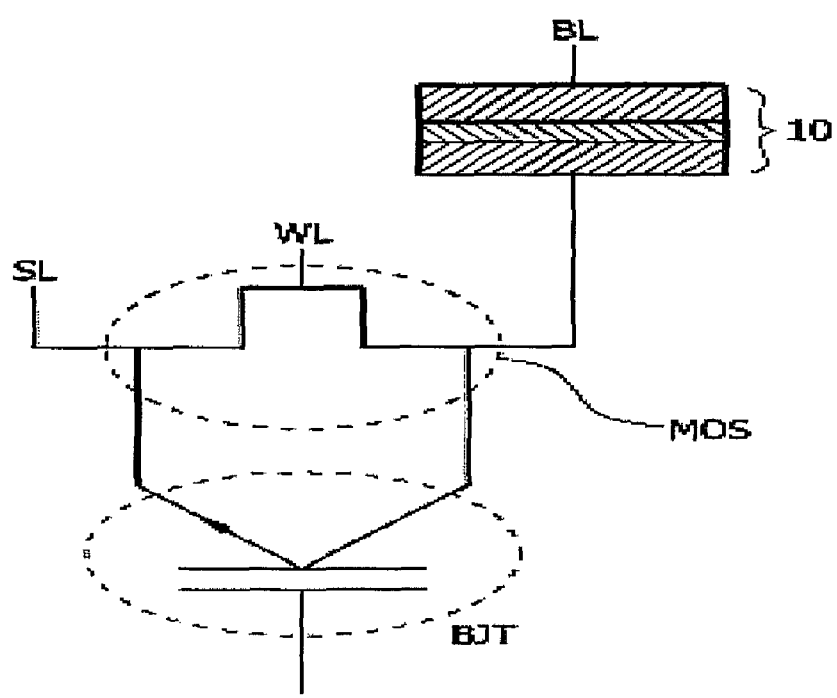
FIGS. 3A and 3B are a circuit diagram and a sectional view, respectively, of a magnetoresistive memory cell according to an embodiment of the present invention.
Figure 3B:
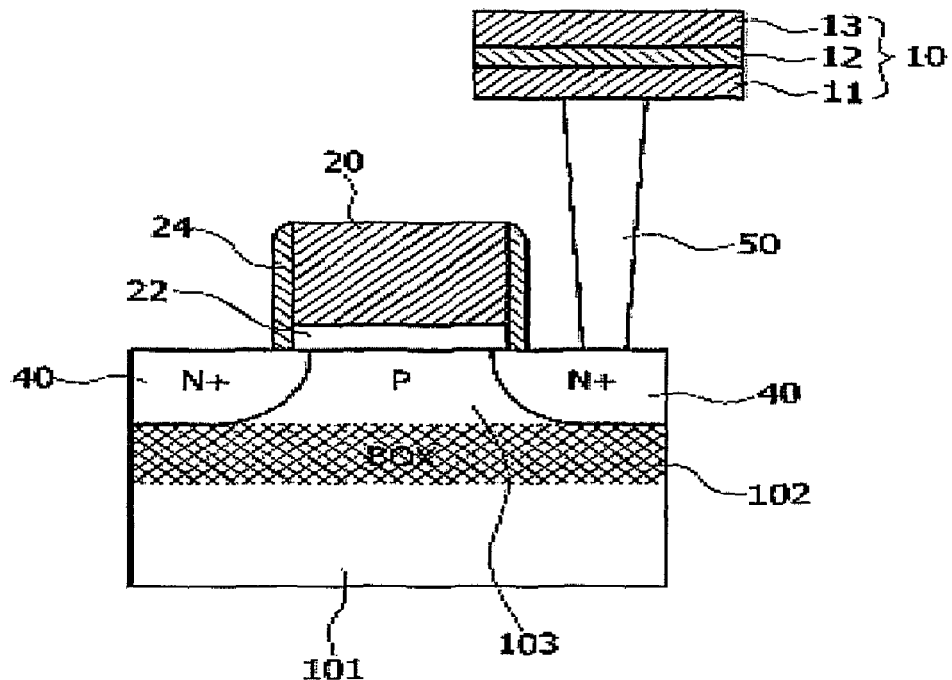

FIGS. 3A and 3B are an equivalent circuit diagram and a sectional view, respectively, of a magnetoresistive memory cell according to an embodiment of the present invention. Referring to FIGS. 3A and 3B, a select transistor functioning as a switching device has a structure in which a MOS transistor Tr and a Bipolar Junction Transistor (BJT) are coupled to each other. The select transistor having this structure can be manufactured through the following process.

First, a Silicon-On-Insulator (SOI) semiconductor substrate having a structure, in which a first conduction-type (for example, P-type) semiconductor layer 103, a buried Oxide 102 and a base substrate 101 are stacked one on top of another, is provided. A gate insulating layer 22 is disposed on the top of the semiconductor layer 103, and thus a gate electrode 20 is formed. In the semiconductor layer 103, first and second diffusion regions 40, each having a second conduction type (for example, N+ type) opposite the first conduction type, are formed. The first and second diffusion regions 40 each function as a source or a drain, and are formed to be spaced apart from each other in opposite regions below the gate electrode 20. The first and second diffusion regions 40 may be formed by injecting N-type impurities into the semiconductor layer 103 through ion injection using the gate electrode 22 as a mask. In particular, the first and second diffusion regions 40 are formed to have a depth reaching a buried oxide 102 below them through ion injection. Accordingly, part of the semiconductor layer 103 between the first and second diffusion regions 40 may be formed as an electrically floating body region. That is, the body region is electrically isolated by the first and second diffusion regions 40, the gate insulating layer 22 and the buried oxide 102. Therefore, spacers 24 for insulation are formed on the sidewalls of the gate electrode 22, so that the select transistor having the structure of FIG. 3B may be manufactured. Meanwhile, the MTJ device includes a free magnetic layer 13, a tunnel barrier layer 12 and a pinned magnetic layer 11, and one end thereof is electrically connected to one of the first and second diffusion regions 40.

In this way, the select transistor of the magnetoresistive memory cell according to the present invention has a structure in which the N-channel MOS transistor (MOS Tr) composed of the gate electrode 20; the first and second diffusion regions 40; and the body region 103 is coupled to the NPN Bipolar Junction Transistor (BJT) composed of the first and second diffusion regions 40; and the body region 103. Here, FIG. 3B shows an example of the formation of the select transistor using the SOI semiconductor substrate, but those skilled in the art will easily understand that any structure having the electrically floating body region 103 between the first and second diffusion regions 40 is included in the scope of the present invention. Furthermore, FIGS. 3A and 3B show a structure in which the N-channel MOS transistor and the NPN BJT are coupled to each other. However, it will be understood that the structure of the present invention is not limited to this structure, and a structure in which a P-channel MOS transistor and a PNP BJT are coupled to each other is also included in the scope of the present invention.

Figure 2:
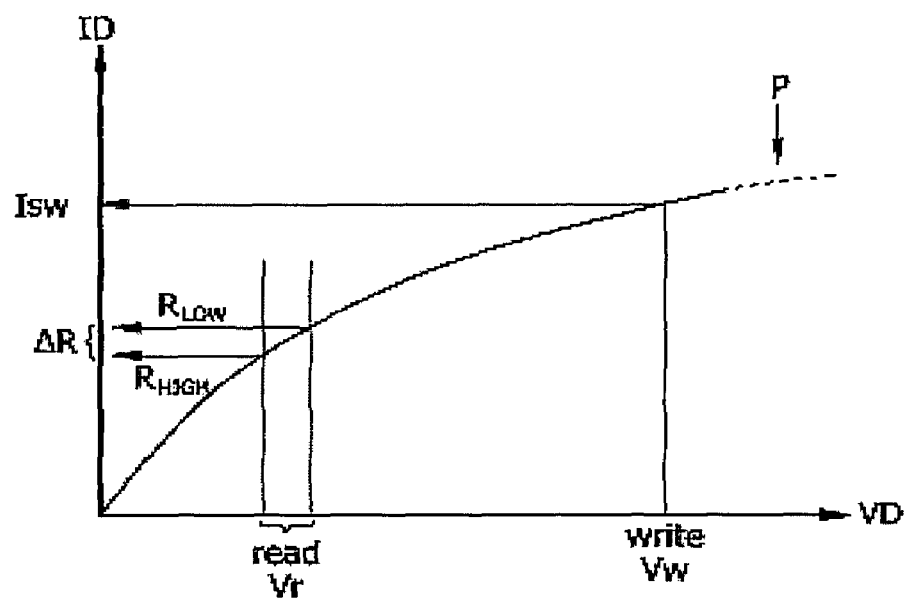
FIG. 2 is a graph showing the current-voltage characteristics of a MOS transistor formed in the conventional magnetoresistive memory device of FIGS. 1A and 1B.
Figure 4:
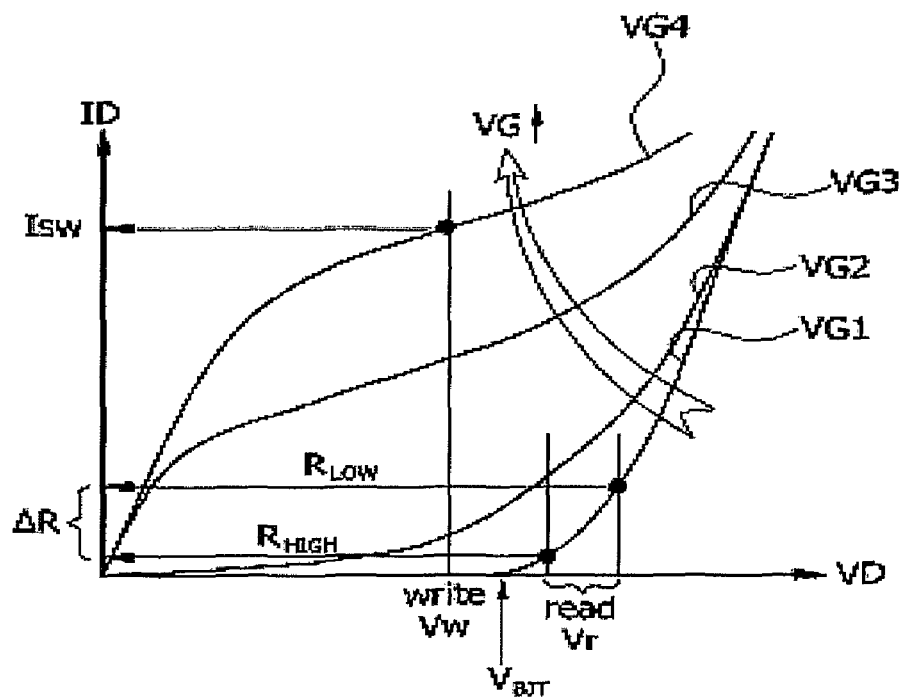
FIG. 4 is a graph showing the current-voltage characteristics of a select transistor according to an embodiment of the present invention.

The present invention uses a floating body effect in the operation of the select transistor. FIG. 4 is a graph showing the current-voltage characteristics of the select transistor according to an embodiment of the present invention, wherein variation in drain current ID versus drain voltage VD at various gate voltages VG is shown (VG1<VG2<VG3<VG4). As shown in FIG. 4, in the select transistor according to the present invention, holes are accumulated in the body region due to the floating body effect, so that the threshold voltage of the transistor decreases. Due to the threshold voltage decreasing in this way, current suddenly increases more at a specific voltage. As a result, higher current than that of the conventional MOS transistor (refer to FIG. 2) may flow through the select transistor according to the present invention. For reference, FIG. 4 illustrates voltage-current characteristics in a region in which a BJT is operated. It is understood that such an effect appears because the amount of the current through the MOS transistor included in the overall current increases as a gate voltage increases.

Figure 5:
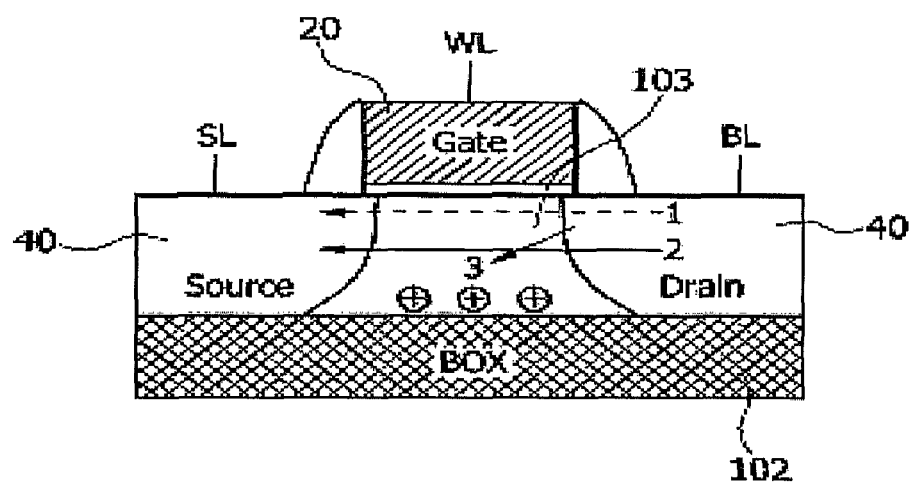
FIG. 5 is a diagram schematically showing the paths of MOS current and BJT current flowing through the select transistor according to an embodiment of the present invention.

FIG. 5 is a diagram schematically showing the paths of MOS current and BJT current flowing through the select transistor according to an embodiment of the present invention. Here, the MOS transistor current 1 flows along the surface of a channel in a direction of an arrow (electrons flow from a source to a drain), and BJT current 2 flows through the entire region of the semiconductor layer 103. Base current, exciting the BJT current 2, is the flow of holes 3 caused by impact ionization occurring when high-energy electrons collide with the drain due to the BJT current 2.

Referring back to FIG. 4, when the select transistor of the present invention is applied to the magnetoresistive memory device, write current Isw is the sum of the MOS transistor current and the BJT current and passes through the MTJ device 10. In particular, the reason for indicating write voltage Vw on VG4 and on low VD in FIG. 4 is that, as an externally applied voltage passes through the MTJ device 10, a voltage drop attributable to high current occurs. Furthermore, in a read mode, a current region varying sensitively to VD is selected, so that resistance difference ΔR and current difference, which are at least several times as large as those of a conventional memory device, may be caused.

[Memory Cell Array and Operation Method Thereof]

A memory array may be constructed by using the magnetoresistive memory cell according to the present invention as each unit memory cell. For example, referring to FIGS. 3A and 3B, each memory cell includes the MTJ device 10, and the select transistor composed of a MOS transistor (MOS Tr) and a BJT coupled to each other. In this case, a word line WL is electrically connected to the gate electrode 20, a bit line BL is electrically connected to one of the first and second diffusion regions 40 through the MTJ device 10, and a source line SL is electrically connected to the remaining one of the first and second diffusion regions 40. As described above, the select transistor of the magnetoresistive memory device according to the present invention simultaneously operates the MOS transistor and the BJT, thus enabling a data write or read mode to be executed.

Figure 6:
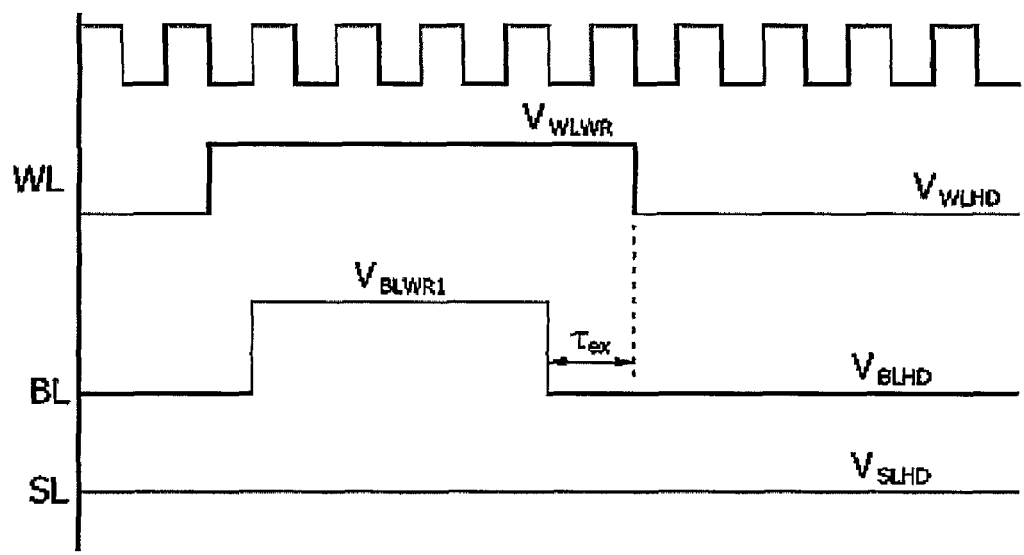
FIG. 6 is a timing diagram showing a data write operation in a magnetoresistive memory device according to an embodiment of the present invention.

With reference to FIG. 6, the data write mode of the magnetoresistive memory device according to an embodiment of the present invention is described below. FIG. 6 is a timing diagram showing an operation of writing, for example, data "0". As shown in FIG. 6, the MOS transistor is turned on by applying a first turn-on voltage ($V_{WLWR}$, for example, VG4; refer to FIG. 4) to the word line WL, and the BJT is operated by applying a high voltage ($V_{BLWR1}$) to the bit line BL.

Preferably, before the voltage $V_{WLWR}$ applied to the word line WL falls down and reaches a voltage $V_{WLHD}$, that is, during the time corresponding to delay time $\tau_{ex}$, the voltage $V_{BLWR1}$ applied to the bit line BL is caused to fall down and reach a voltage $V_{BLHD}$. That is, when data writing has been completed, the first turn-on voltage $V_{WLWR}$ applied to the word line WL falls down after being maintained for a predetermined delay time $\tau_{ex}$ from the time point at which the operating voltage $V_{BLWR1}$ of the BJT applied between the bit line and the source line has fallen down. The reason for this is to extract holes accumulated in the body region 103 after the write operation has been completed. When the potential of the word line WL is maintained at a level higher than that of the source line or the bit line for a predetermined period of time from the time point at which the bit line BL has fallen down, the potential of the body region 103 may return to an initial state. Here, the delay time $\tau_{ex}$ may be set as a value within a range from 0.1 to 10 nanoseconds.

Figure 7:
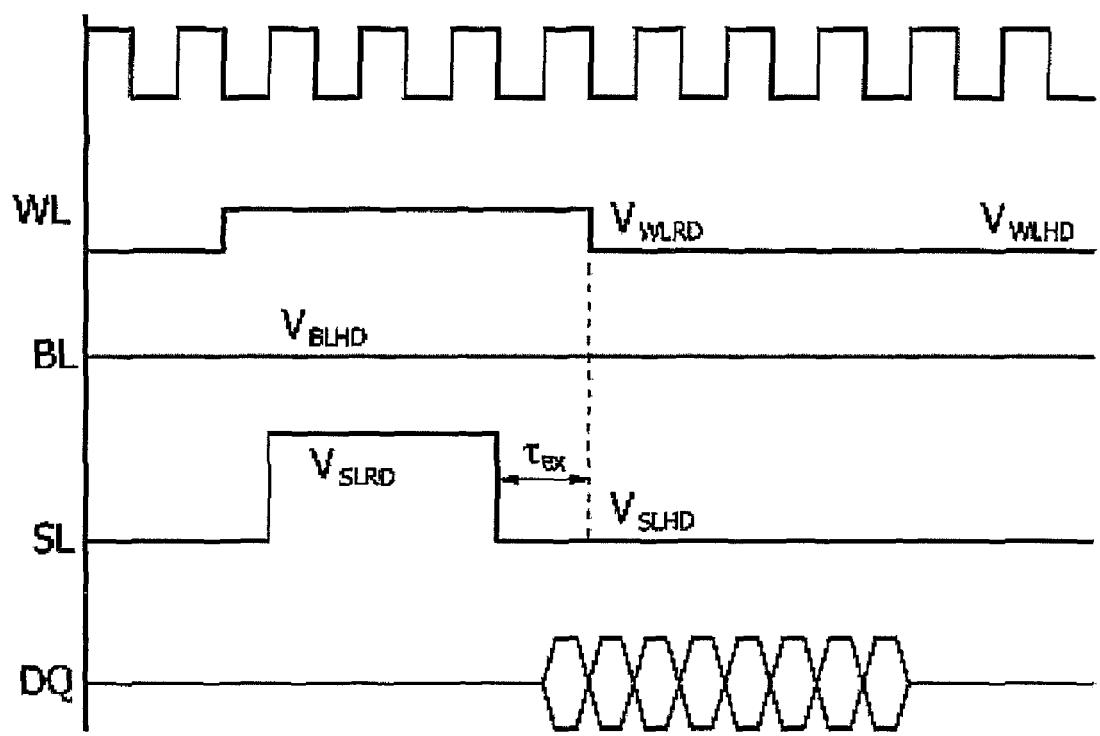
FIG. 7 is a timing diagram showing a data read operation in the magnetoresistive memory device according to an embodiment of the present invention.

Next, with reference to FIG. 7, the data read mode of the magnetoresistive memory device according to an embodiment of the present invention is described below. FIG. 7 is a timing diagram showing a data read operation. As shown in FIG. 7, the MOS transistor is turned on by applying a second turn-on voltage ($V_{WLRD}$, for example, VG1; refer to FIG. 4) to the word line WL and the BJT is operated by applying a high voltage $V_{SLRD}$ to the source line SL. For reference, the second turn-on voltage of the MOS transistor is preferably selected as a voltage lower than the first turn-on voltage because of the reason described with reference to FIG. 4.

In this case, a difference may exist in the voltage between the emitter and the collector of the BJT according to the resistance of the MTJ device 10, so that a difference may also exist in current flowing through the bit line BL. Therefore, it is preferable that, even in the read mode, before voltage $V_{WLRD}$ applied to the word line WL is caused to fall down and reach a voltage $V_{WLHD}$, that is, during a delay time $\tau_{ex}$, the voltage $V_{SLRD}$ applied to the source line SL be caused to fall down and reach the voltage $V_{SLHD}$. That is, when data reading has been completed, the second turn-on voltage $V_{WLRD}$ applied to the word line WL falls down after being maintained for the predetermined delay time $\tau_{ex}$ from the time point at which the operating voltage $V_{SLRD}$ of the BJT applied between the bit line and the source line has fallen down. Through this operation, the voltage of the word line WL is maintained at a level higher than that of the source line or the bit line for a predetermined period of time, so that holes accumulated in the body region 103 are extracted, and thus the potential of the body region 103 may return to an initial state. Here, the delay time $\tau_{ex}$ may be set as a value within a range from 0.1 to 10 nanoseconds.

Figure 8:
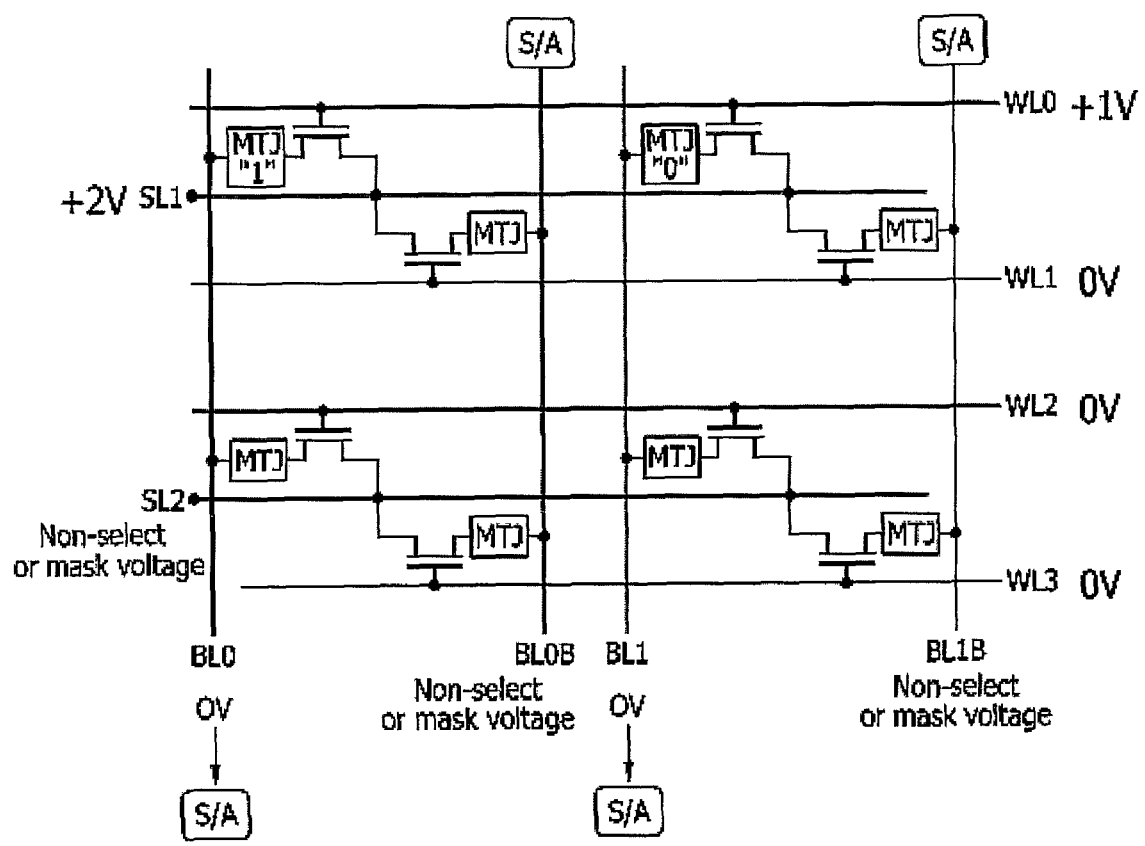
FIG. 8 is a circuit diagram showing the construction of an 8-bit array as an example of the magnetoresistive memory device according to an embodiment of the present invention.

Next, with reference to FIG. 8, the read mode of the magnetoresistive memory device according to an embodiment of the present invention is described using an 8-bit array as an example. As shown in FIG. 8, when one of a plurality of word lines WL (for example, a voltage of +1V is applied thereto) is selected, a voltage higher than the BJT operating voltage (for example, +2V) is applied to a source line SL corresponding to the selected word line WL. At this time, in a structure in which two neighboring memory cells share a source line (+2V is applied thereto), a bit line BL connected to a memory cell selected to read data is connected to a Sense Amplifier (S/A) and the voltage thereof becomes 0V. A bit line BL connected to the remaining neighboring memory cell enters a state in which voltage at one end of the bit line BL is disconnected by a bit line select transistor, and current does not flow through the bit line BL. Therefore, data "1" or "0" is read from respective memory cells selected by the bit line BL set as 0V. Meanwhile, when the bit line select transistor is blocked, there is a probability that a charging current is generated on the bit line BL for a very short period of time. In this case, only masking needs to be performed through an emitter-collector voltage (mask voltage), at which the BJT is not operated, by applying a suitable voltage existing between voltages at the bit line BL and the source line SL.

In the select transistor of the magnetoresistive memory cell according to the present invention, the threshold voltage of the MOS transistor decreases and current flowing into the select transistor increases because of impact ionization occurring near a drain junction due to MOS transistor current. Therefore, when the select transistor, having a structure in which a MOS transistor and a BJT are coupled to each other, is employed as in the case of the present invention, high write current required for magnetic tunnel junction can be obtained. Further, when the potential of the body region increases to such an extent that a diode between the source and the body region is in a forward bias condition while current flows, a structure in which a BJT is additionally formed in a MOS transistor is realized, so that bipolar current additionally flows through the entire portion of the body region as well as the surface of the channel, thus consequently obtaining much higher current than that of a conventional MOS transistor. Therefore, the select transistor using the floating body effect is constructed, so that a select transistor having a better current driving capability than that of the conventional MOS transistor can be implemented. As a result, high integration of the magnetoresistive memory device can be achieved.

In the magnetoresistive memory device, data is read by discriminating the magnitudes of flowing currents depending on the magnitudes of resistances of a magnetic tunnel junction. Therefore, when the resistance of the select transistor connected in series with the magnetic tunnel junction is high (that is, when current driving capability is small), a current difference in a read operation decreases, and thus errors may easily occur. However, the select transistor according to the present invention reduces resistance in the transistor by using the floating body effect, thus enabling the resistance difference of the magnetic tunnel junction to be reflected in a read operation at a higher rate. Furthermore, since bipolar current greatly depends on a voltage between a source and a drain, a larger read current difference may be obtained at the time of a read operation. Therefore, when a bipolar operation is used for a read operation, the current difference between data "1" and "0" is increased, thus improving a signal sensing margin.

Meanwhile, when the threshold voltage of the transistor increases even after the write operation of the magnetoresistive memory device according to the present invention has been completed, leakage current may be generated. To address this concern, the potential of the word line is maintained at a level higher than that of the bit line or the source line after the write mode has been completed. Accordingly, since the potential of the body region becomes higher than that of the source line or bit line by the coupling between the gate electrode and the body region, forward current flows between the body region and the source and between the body region and the drain, thus enabling charges accumulated in the body region to be extracted. Thereafter, when the voltage of the word line decreases, the body region returns to an initial state, thus suppressing the generation of leakage current caused by the increase in a threshold voltage. Similarly, even after the read operation has been completed, the potential of the word line is maintained at a level higher than that of the bit line or the source line, thus enabling charges accumulated in the body region to be extracted and allowing the body region to return to the initial state.

Furthermore, when a BJT is formed by using a fin-shaped channel in a select transistor according to the present invention, capacitance between the gate electrode and the body region increases, thus smoothly adjusting a body potential through a gate voltage. Therefore, when a select transistor having such a fin-shaped channel is manufactured, a short channel effect can be suppressed, MOS current can be increased, and the operation of the BJT can be effectively controlled.

According to the present invention, an area in which a select transistor capable of ensuring the amount of current required to change the data storage state of an MTJ device is formed can be minimized, and thus the present invention can be effectively applied to high integration of a magnetoresistive memory device.

Further, a select transistor according to the present invention can ensure current difference which is at least twice as high as that of a conventional select transistor while being formed in a minimum area corresponding to the size of an MTJ device, thus simplifying a sensing circuit and improving sensing speed.

Furthermore, in a magnetoresistive memory device according to the present invention, the difference between a read current in a data read mode and a write current in a data write mode increases, thus improving an operating margin of the memory device.

In addition, the present invention is advantageous in that it can contribute to the improvement of the yield of magnetoresistive memory devices through the expansion of an entire margin, can contribute to the realization of high integration and the reduction of manufacturing costs through the reduction of an area required for the formation of a select transistor, and can reduce the entire power consumption by reducing read current in a non-volatile memory device in which a read operation is more important than a write operation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Therefore, embodiments disclosed in the present invention are not intended to limit the technical spirit of the invention, but are intended to describe the technical spirit. The technical scope of the present invention is not limited by the embodiments. Further, it should be understood that the scope of the present invention is interpreted by the accompanying claims, and all technical spirits within a range of equivalents thereof belong to the scope of the present invention.

What is claimed is:

1. A magnetoresistive memory cell, comprising:
    a Magnetic Tunnel Junction (MTJ) device; and
    a select transistor, wherein the select transistor comprises:
        a first conduction-type semiconductor layer;
        a gate electrode formed by disposing a gate insulating layer on top of the semiconductor layer; and
        first and second diffusion regions formed in the semiconductor layer to be spaced apart from each other and to have a second conduction type, wherein a part of the semiconductor layer between the first and second diffusion regions is formed as an electrically floating body region and wherein the select transistor comprises a Metal Oxide Semiconductor (MOS) transistor including the gate electrode, the first and second diffusion regions, and the body region and further comprises a Bipolar Junction Transistor (BJT) including the first and second diffusion regions and the body region.

2. The magnetoresistive memory cell according to claim 1, wherein the MTJ device comprises a free magnetic layer, a tunnel burrier layer and a pinned magnetic layer.

3. The magnetoresistive memory cell according to claim 1, wherein:
    the select transistor is formed on a Substrate-On-Insulator (SOI) semiconductor substrate including the semiconductor layer, a buried oxide, and a base substrate; and
    the body region is electrically isolated by the first and second diffusion regions, the gate insulating layer and the buried oxide.

4. A magnetoresistive memory device, comprising:
    a memory cell including a Magnetic Tunnel Junction (MTJ) device, and a select transistor including a first conduction-type semiconductor layer, a gate electrode formed by disposing a gate insulating layer on top of the semiconductor layer, first and second diffusion regions formed in the semiconductor layer to be spaced apart from each other and to have a second conduction type, wherein a part of the semiconductor layer between the first and second diffusion regions is formed as an electrically floating body region and wherein the select transistor comprises a Metal Oxide Semiconductor (MOS) transistor including the gate electrode, the first and second diffusion regions, and the body region and further comprises a Bipolar Junction Transistor (BJT) including the first and second diffusion regions and the body region;
    a word line electrically connected to the gate electrode;
    a bit line electrically connected to one of the first and second diffusion regions through the MTJ device; and
    a source line electrically connected to a remaining one of the first and second diffusion regions.

5. The magnetoresistive memory device according to claim 4, wherein the MTJ device comprises a free magnetic layer, a tunnel burrier layer and a pinned magnetic layer.

6. The magnetoresistive memory device according to claim 4, wherein:
    the select transistor is formed on a Substrate-On-Insulator (S01) semiconductor substrate including the semiconductor layer, a buried oxide, and a base substrate; and
    the body region is electrically isolated by the first and second diffusion regions, the gate insulating layer and the buried oxide.

7. A method of operating the magnetoresistive memory device according to claim 4, comprising:
    turning on the MOS transistor including the gate electrode, the first and second diffusion regions and the body region; and
    operating the BJT including the first and second diffusion regions and the body region,
    wherein a data write mode or read mode is executed by operating the BJT after the MOS transistor has been turned on.

8. The method according to claim 7, wherein the data write mode of the magnetoresistive memory device is executed by applying a first turn-on voltage of the MOS transistor to the word line, and applying an operating voltage of the BJT between the bit line and the source line.

9. The method according to claim 8, wherein the first turn-on voltage applied to the word line in the data write mode falls down, after being maintained at a voltage level, for a predetermined delay time from a time point at which the operating voltage of the BJT, applied between the bit line and the source line, has fallen down.

10. The method according to claim 9, wherein the delay time falls within a range from 0.1 to 10 nanoseconds.

11. The method according to claim 7, wherein the data read mode of the magnetoresistive memory device is executed by applying a second turn-on voltage of the MOS transistor to the word line and applying an operating voltage of the BJT between the bit line and the source line.

12. The method according to claim 11, wherein the second turn-on voltage applied to the word line in the data read mode falls down after being maintained at a voltage level, for a predetermined delay time, from a time point at which the operating voltage of the BJT, applied between the bit line and the source line, has fallen down.

13. The method according to claim 12, wherein the delay time falls within a range from 0.1 to 10 nanoseconds.

14. The method according to claim 8, wherein the data read mode of the magnetoresistive memory device is executed by applying a second turn-on voltage lower than the first turn-on voltage of the MOS transistor to the word line, and applying the operating voltage of the BJT between the bit line and the source.

15. A magnetoresistive memory device comprising:
   a memory cell including a Magnetic Tunnel Junction (MTJ) device; and
   a select transistor including a Metal Oxide Semiconductor (MOS) transistor and a Bipolar Junction Transistor (BJT) that are connected in parallel, wherein the MOS transistor and the BJT are connected in common to the MTJ device, are configured to supply current to the MTJ device in response to a gate voltage applied to the gate electrode of the select transistor, and share a common floating body region between a source region and a drain region of the select transistor.

16. The magnetoresistive memory device of claim 15, wherein:
   the select transistor is formed on a Substrate-On-Insulator (SOI) semiconductor substrate including the floating body region, a buried oxide, and a base substrate; and
   the body region is electrically isolated by the first and second diffusion regions, a gate insulating layer and the buried oxide.

17. The magnetoresistive memory device of claim 15, wherein:
   the MOS transistor includes the gate electrode, the first and second diffusion regions, and the body region; and
   the BJT includes the first and second diffusion regions and the body region.

* * * * *